United States Patent [19]

Ameti

[11] Patent Number: 5,408,628
[45] Date of Patent: Apr. 18, 1995

[54] SOLID STATE RECORDER WITH FLEXIBLE WIDTH DATA BUS UTILIZING LOCK MAPPING AND ERROR CORRECTION AND DETECTION CIRCUITS

[75] Inventor: Aitan Ameti, German Town, Md.

[73] Assignee: Odetics, Inc., Anaheim, Calif.

[21] Appl. No.: 910,720

[22] Filed: Jul. 7, 1992

[51] Int. Cl.⁶ .................. G06F 12/04; G06F 13/00
[52] U.S. Cl. ................. 395/425; 364/DIG. 1;
364/252.5; 364/254.9; 364/260; 364/265.1;
364/926.93; 364/944.5; 371/21.6; 395/275
[58] Field of Search ................. 395/425, 400;
364/200 MS File, 900 MS File; 371/2.1, 2.2,
10.1, 10.2, 16.5, 21.1, 21.6, 37.1

[56] References Cited

U.S. PATENT DOCUMENTS

| | | | |
|---|---|---|---|
| 4,593,267 | 6/1986 | Kuroda et al. | 340/347 |
| 4,641,309 | 2/1987 | Nakano et al. | 371/37 |
| 4,718,067 | 1/1988 | Peters | 371/37 |
| 4,864,572 | 9/1989 | Rechen et al. | 371/2.1 |
| 4,901,319 | 2/1990 | Ross | 371/2.1 |
| 5,022,029 | 6/1991 | Guichon | 371/2.1 |
| 5,128,941 | 7/1992 | Russell | 371/2.2 |
| 5,243,428 | 9/1993 | Challapali et al. | 371/31 |
| 5,247,638 | 9/1993 | O'Brien et al. | 395/425 |

*Primary Examiner*—Joseph L. Dixon
*Assistant Examiner*—Frank J. Asta
*Attorney, Agent, or Firm*—Graham & James

[57] ABSTRACT

A solid state data recorder employs a solid state memory to record data in the form of data words of variable length transmitted to the memory on a flexible width data bus. The memory is monitored to determine failed memory locations, and such locations are mapped out so as not to be used to store data. Bus lines are selected lines in accordance with mapped out memory locations in order to transfer the variable length data words to and from the memory. By employing the variable length data words and flexible width data bus, loss of useable recording space in the memory is very gradual, thus minimizing the amount of spare memory area required.

25 Claims, 15 Drawing Sheets

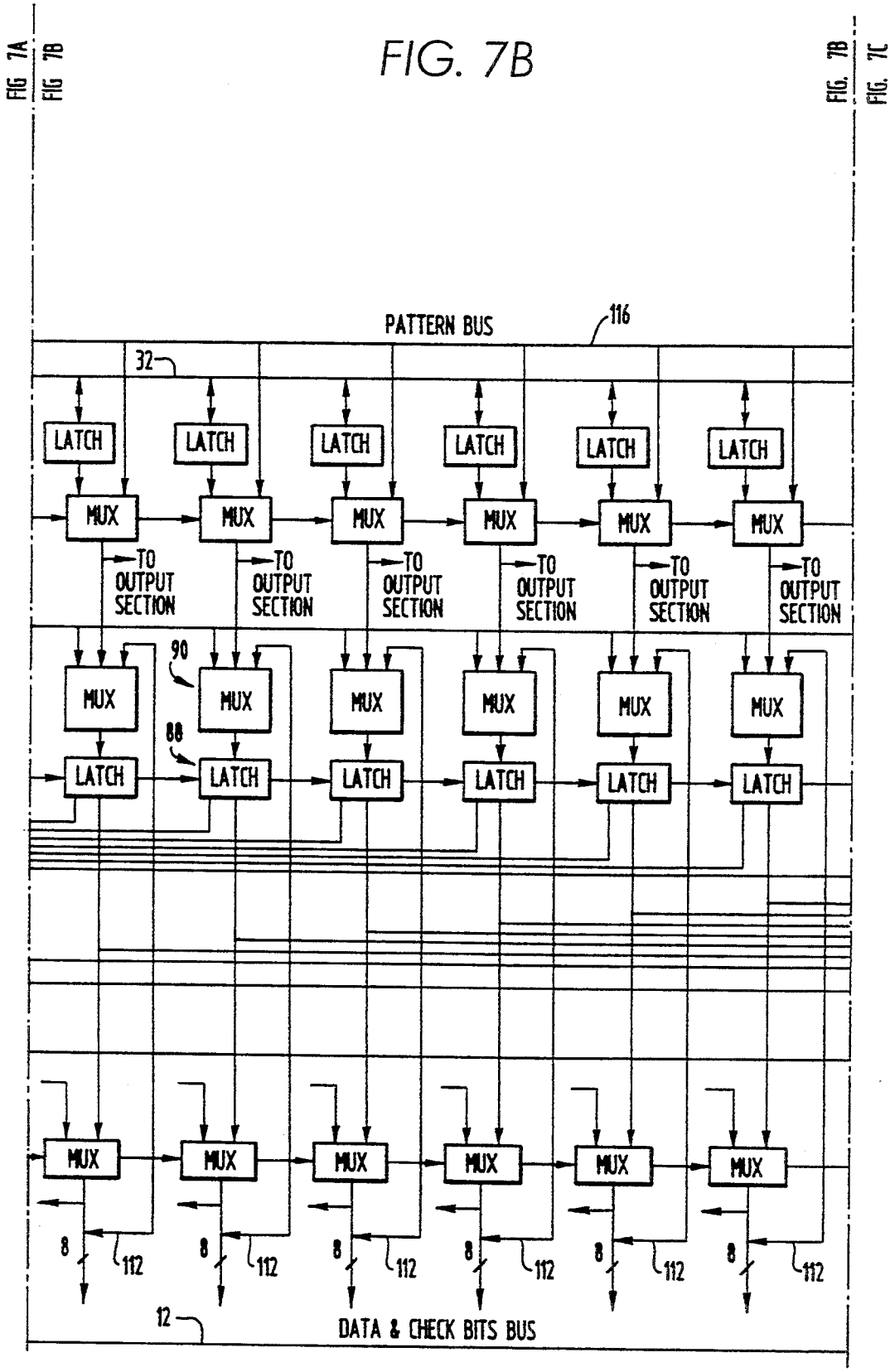

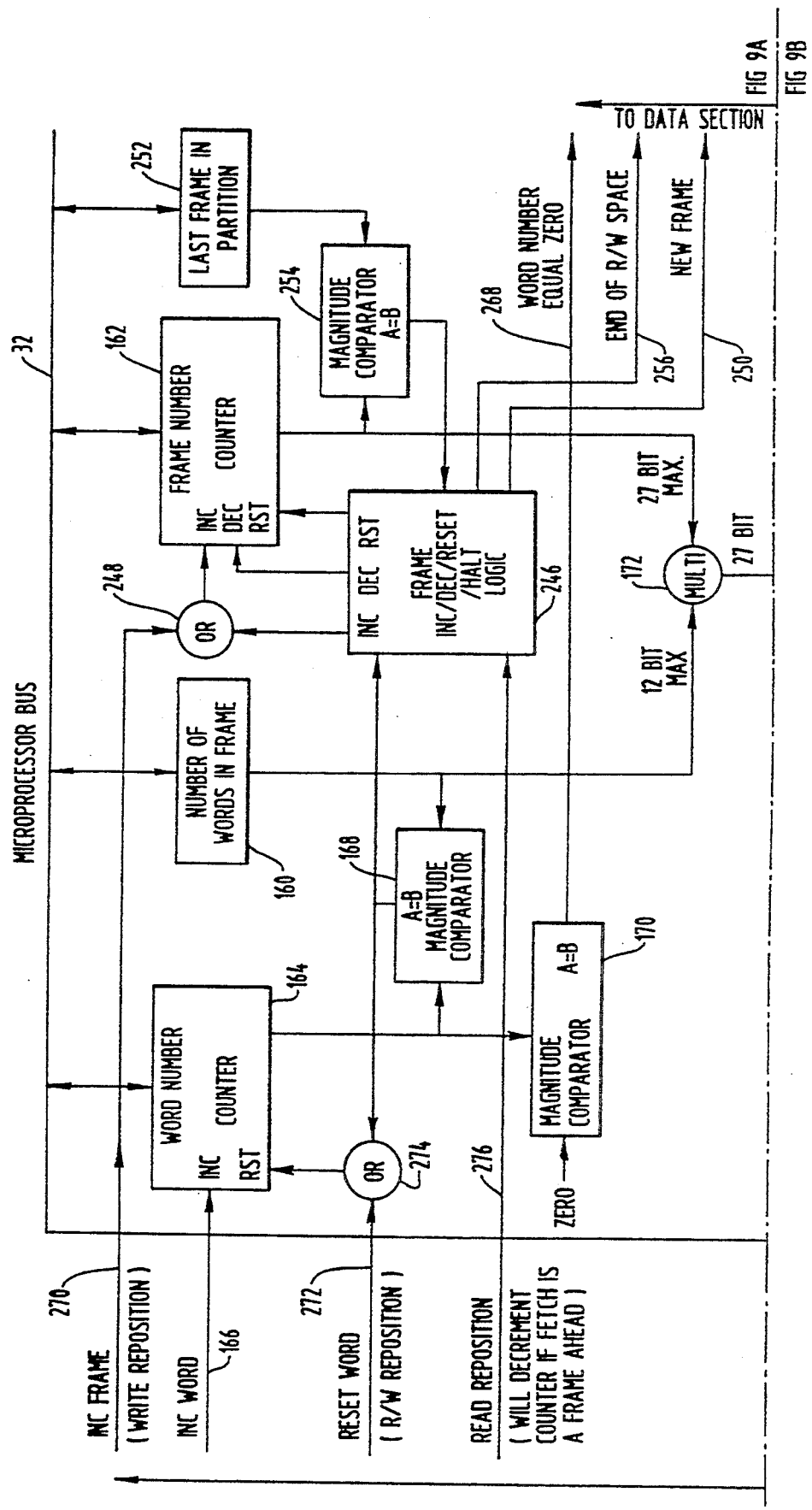

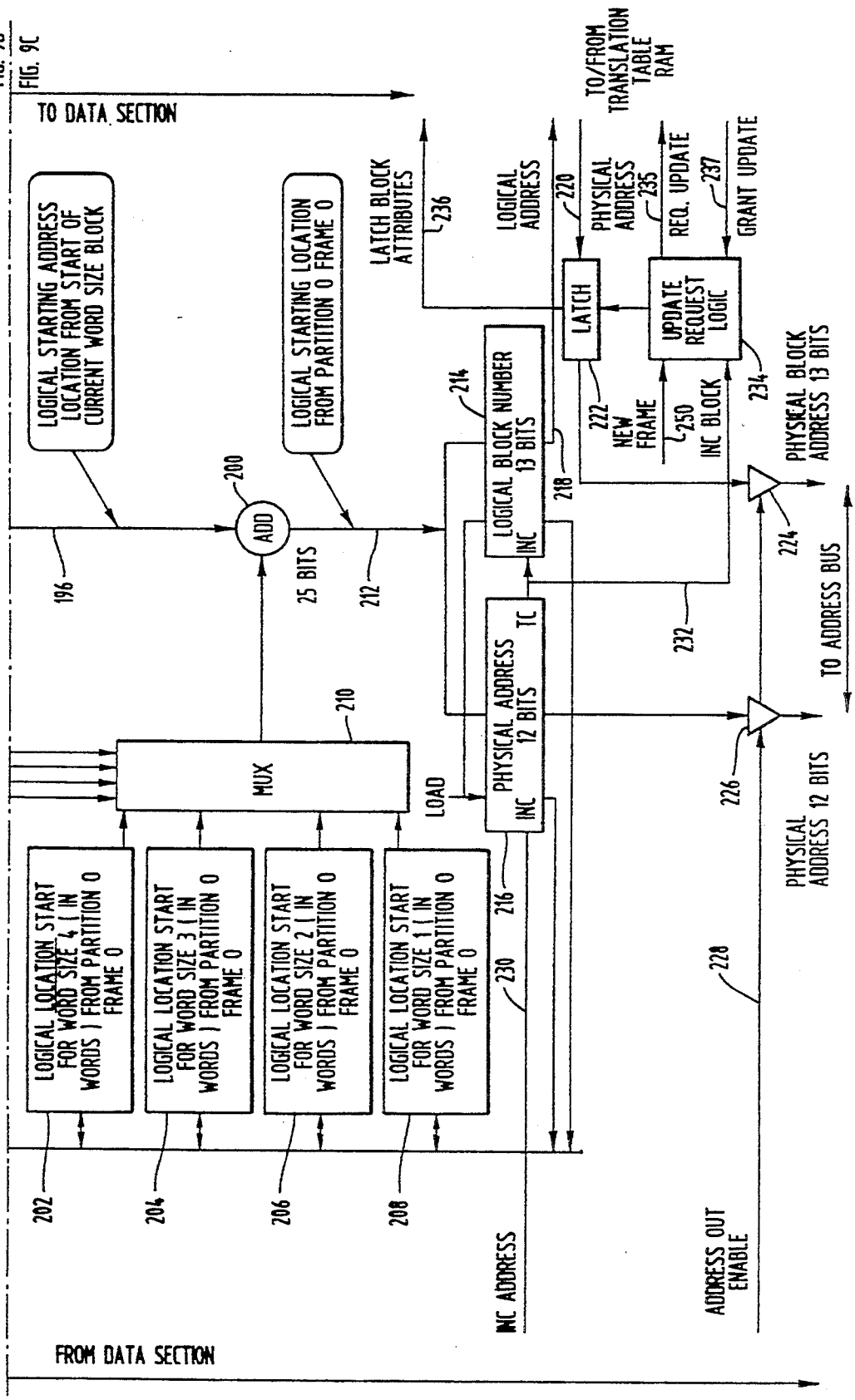

5,408,628

SOLID STATE RECORDER WITH FLEXIBLE WIDTH DATA BUS UTILIZING LOCK MAPPING AND ERROR CORRECTION AND DETECTION CIRCUITS

BACKGROUND OF THE INVENTION

1. Field of the Invention

The present invention is directed to digital data transmission employing a data bus and data storage in a solid state memory which is accessed by the bus. More particularly, the present invention is directed to a bus system in which a variable number of bus lines are employed to transmit data and a variable number of storage locations corresponding to different data word locations in a memory are employed. The invention has a particular application with respect to solid state data recorders such as those employed in space missions in satellites or manned spacecraft. Solid state data recorders employ solid state memory devices to store data, in contrast to the typical storage medium of magnetic tape. Such recorders can provide improved reliability in that they do not require complicated tape handling mechanisms. In solid state recorders, data is stored by appropriately addressing a random access memory (RAM) and recording a series of data words of a predetermined number of bits each.

Since there are no moving mechanisms for tape handling or the like, solid state recorders can provide a high degree of reliability. However, such recorders are typically very expensive due to the high cost of memory. Moreover, in the space environment where repair generally is not possible during the course of a mission, provision must be made to ensure a certain recording capacity throughout the life of the mission. Thus, sufficient overall memory capacity must be provided such that even after failure of a number of memory devices during a mission sufficient overall capacity will be retained. In effect, "spare" memory devices must be provided to replace failed devices in order to maintain a nominal recording capacity. The necessity to provide spare devices further increases the overall cost of the system.

2. Description of the Prior Art

Various solid state recorders have been proposed in the past, such as that shown in U.S. Pat. No. 4,970,648 to Capots. The recorder disclosed in this patent has the capability of detecting errors in its memory and avoiding use of portions of the memory that have errors. The memory is controlled by a control CPU on the basis of "pages", which are the smallest portion of the memory array which has meaning to the CPU. The system evaluates the memory to detect pages which have non-correctable errors. Such pages are then removed from use. In this fashion, failed memory locations are avoided and reliability is maintained.

Although a system in which memory pages are removed provides the necessary reliability, the cost can be extremely high in terms of memory requirements. This is especially so since failures are very often isolated in a relatively small memory area (even an individual storage location), and the removal of an entire page of memory often results in the removal of a significant amount of usable memory along with failed memory. The result is that greater memory overhead is required to maintain the specified data capacity, and cost is significantly increased.

SUMMARY OF THE INVENTION

The present invention is directed to a solid state recorder in which memory sparing efficiency is greatly improved and the removal of memory is much more closely mapped to correspond to memory devices which have actually failed, thereby avoiding the unnecessary removal of usable memory. This is accomplished by employing a unique flexible width data bus and variable word length system. The system nominally records data words of a predetermined length, e.g., seventy-two bits. These data words are provided to the memory via a seventy-two bit data bus. The data words are formed of plural input words of, e.g., sixteen bits each, which have been combined along with error detection and correction bits to form a seventy-two bit data word. When failed memory locations are detected, fewer input words are combined and the length of the formed data word is reduced. The shortened data word is provided along appropriately selected bus lines to memory locations in the word storage area which are still usable. Bus lines corresponding to failed storage locations are masked out and are not employed to store input data. In this fashion, memory can be removed on a fraction of a data word basis, thus greatly reducing the amount of good memory area which is taken out of use. In a similar manner, if a bus line, bus driver or bus receiver fails, the bus line can be masked out so as to maintain the integrity of the remaining bus lines.

Upon readout, data from the failed memory areas is not employed and the input words which make up a particular data word are extracted. The invention greatly reduces the rate at which usable memory is removed by employing a variable data word length and a variable width data bus. That is, although a data bus of predetermined width is provided, the number of lines of the data bus which are used to transmit input data words varies depending upon what locations of a memory are to be employed.

BRIEF DESCRIPTION OF THE DRAWINGS

The invention will be described with reference to the accompanying drawings, wherein:

FIGS. 7A, 7B and 7C are a block diagram of the input circuit of the recorder of the present invention;

FIGS. 9A, 9B and 9C are a block diagram of the address generator of the present invention.

DESCRIPTION OF THE PREFERRED EMBODIMENT

The following description is of the best presently contemplated mode of carrying out the invention. This description is made for the purpose of illustrating the general principles of the invention and is not to be taken in a limiting sense. The scope of the invention is best determined with reference to the appended claims. In particular, although the invention is described in terms of a solid state recorder, the flexible width data bus of the present invention may also be used for other applications.

Figure 1:
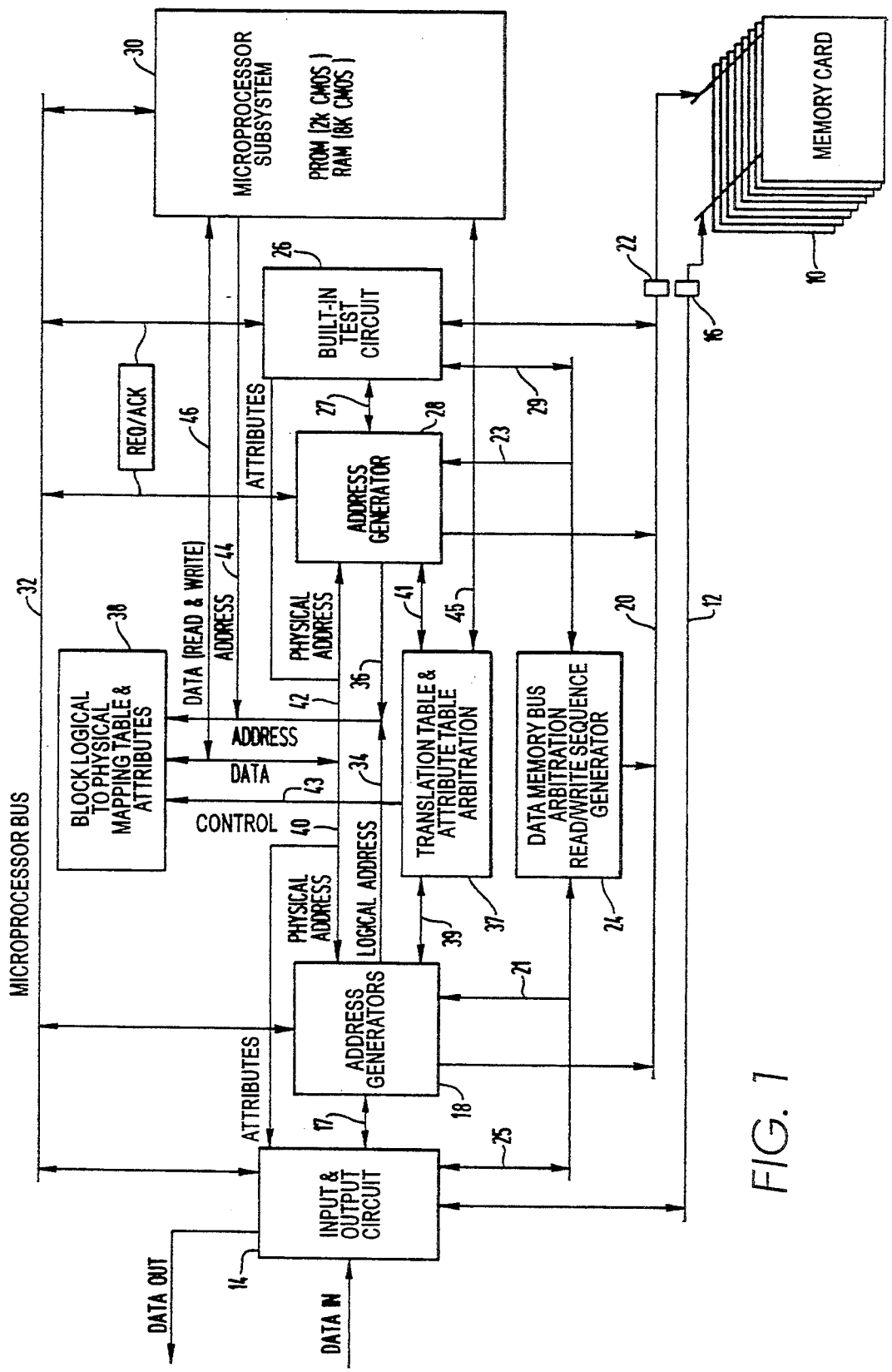
FIG. 1 is a block diagram of the solid state recorder of the present invention.

Referring to FIG. 1, the solid state recorder of the present invention includes a memory array 10 which in the present embodiment is formed of eight separate memory cards each including one hundred forty-four static random access memory (SRAM) devices per side. Each SRAM has a capacity of one megabit that is organized as 128K by 8 bits wide. The total capacity of the memory array is therefore 2.25 gigabits. As will be discussed in more detail subsequently, the memory is configured to provide 1.8 gigabits of user memory, 225 megabits of error detection and correction memory and 225 megabits of spare memory for replacing failed memory sections.

Data is transmitted to and from the memory cards 10 via a seventy-two bit wide (i.e., seventy-two separate lines) data bus 12. The data bus is coupled to an input and output circuit 14 which receives data to be stored in the memory 10 at a data input port and provides data read out from the memory 10 at a data output port. A buffer 16 is connected on the data bus between the memory 10 and the input and output circuit 14.

Addressing of the appropriate memory locations is controlled by address generator circuits 18 which provide a twenty-five bit address to the memory 10 by way of an address bus 20 having a buffer 22. The address generators 18 also communicate with the input and output circuit 14 as will be described subsequently. In addition to the address signals, the bus 20 also provides read/write control signals to the memory 10. These are provided from a main memory arbitration logic and read/write sequence generator 24. This circuitry communicates with the input and output circuit 14 via interface 25, a built-in test circuit 26 via interface 29 and address generator circuits 18 and 28 via interfaces 21 and 23 and determines access to the data bus 12 as well as controlling reading and writing operations of the memory 10. The arbitration logic receives bus requests and, based upon a fixed priority, grants bus access to one requesting circuit at a time.

The built-in test circuit 26 replicates the input and output circuit 14 to provide test data to store in the memory 10 and subsequently read out in order to detect failed memory locations. Separate address generator circuits 28 are associated with the built-in test circuit.

In the present embodiment of the invention, the input and output circuit, addressing circuits and built-in test circuit are formed as special purpose integrated circuits in order to provide maximum speed of operation, with a microprocessor subsystem 30 performing background processing operations. However, it should be noted that the functions of these logic circuits could all be accomplished by a microprocessor configuration.

The solid state recorder system treats the memory 10 as a logical memory space which is divided into a number of partitions each of which include a number of blocks of memory. Data is requested to be written into or read out of the logical memory by means of logical requests provided to the address generators 18 and 28 from the input and output circuit 14 or the built-in test circuit 26 via address generator interfaces 17 and 27, respectively. The address generators 18 and 28 in turn provide logical addresses on lines 34 and 36, respectively, to a block logical-to-physical translation table and attributes memory 38 which includes memory containing logical-to-physical mapping information for the main memory 10. Arbitration between the mapping table and attributes is controlled by arbitration circuit 37 communicating via interfaces 39 and 41 to address generators. Control signals are provided on line 43. Physical address data corresponding to the logical address is provided back to the address generators 18 and 28 via lines 40 and 42, respectively, and are used by the address generators 18 and 28 to generate an overall physical address to the memory 10. Attribute data is provided back to the input and output circuit 14 and test circuit 26 via lines 40 and 42.

In operation, the system performs actual transfer of data between the input and output ports to the memory array 10 without intervention by the microprocessor 30. The microprocessor subsystem interacts with the data transfer and control section (the input and output circuits and address generators) by maintaining two tables, namely, the logical-to-physical mapping table and the memory attribute table. The memory attribute table contains information for avoiding failed sections of memory. For maximum data transfer speed, the microprocessor 30 is not directly involved with the data transfers but rather performs less time critical tasks of background processing. Microprocessor 30 communicates with the tables 38 via address and data lines 44 and 46, respectively and with arbiter 37 via line 45. The microprocessor 30 includes associated program ROM and working RAM. The information in the table 38 is created and maintained by the microprocessor in response to commanded self-test operations of the self-test circuit which identifies failed memory locations. Once a failure is diagnosed, the microprocessor updates the tables 38 to ensure that future memory operations are not affected by the memory failures. The microprocessor 30 also operates to control initialization of system control registers which govern the acquisition and computation of address information necessary to perform data transfers to the memory 10.

Figure 2:
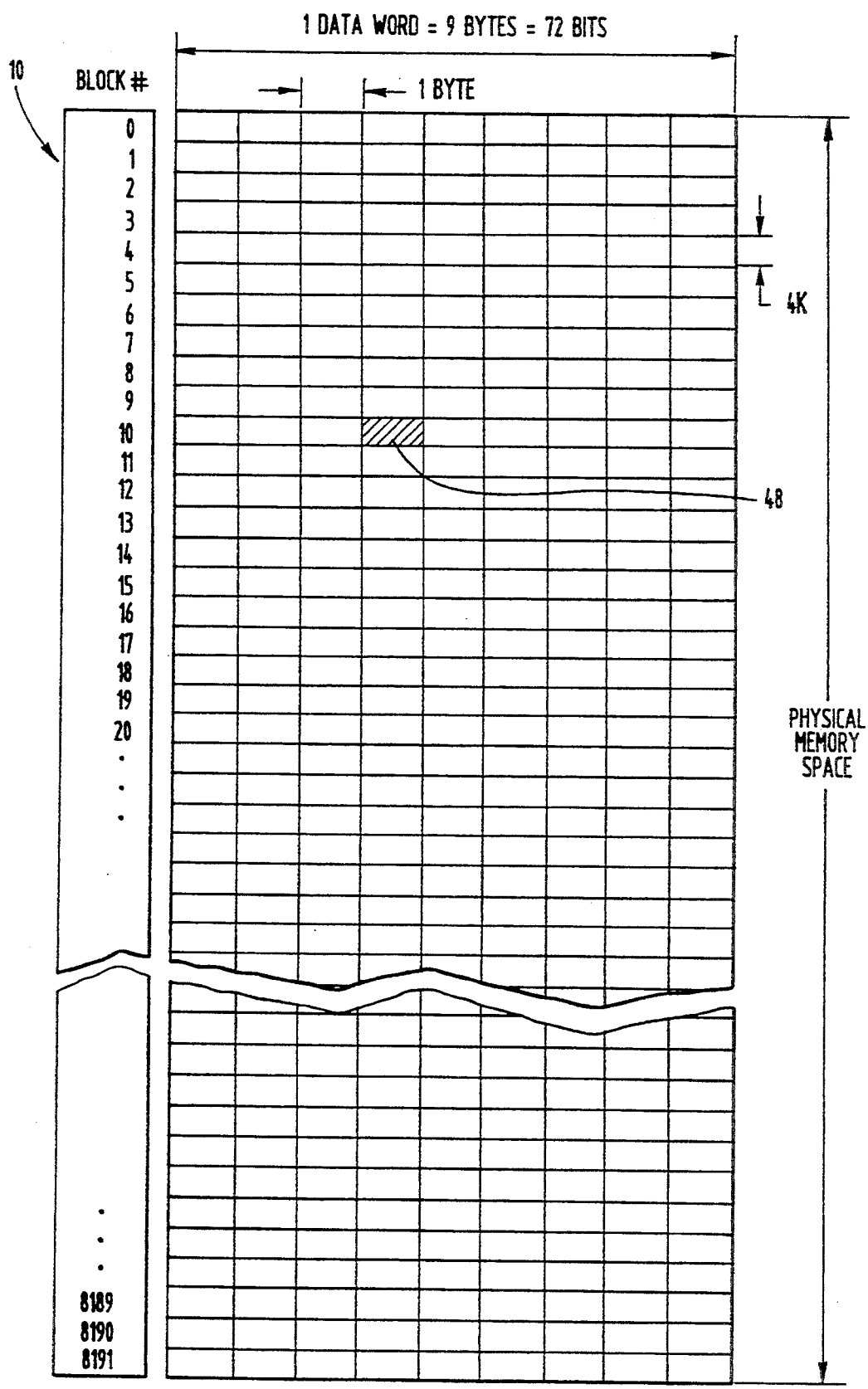
FIG. 2 is a diagram illustrating the physical memory configuration of the present invention.

FIG. 2 illustrates the organization of the physical memory space of the memory 10. The memory is configured as seventy-two bits (9 bytes) wide by 8K (8192) blocks deep with each block being 4K (4096) deep. Each block therefore holds 4K seventy-two bit data words which are transmitted via the seventy-two bit data bus 12. In practice, sixty-four bits of the seventy-two bit word are employed for user data and eight bits are employed to store error detection and correction bits in accordance with Hamming code which is known in the art.

Failures within the memory are determined on a byte (8 bit) basis within each block. The memory is therefore illustrated as being configured such that each block is nine bytes wide. For illustration purposes, a failed byte 48 is illustrated in FIG. 2. The manner of masking this failed section in order to prevent its use in recording data will be described subsequently.

Figure 3:
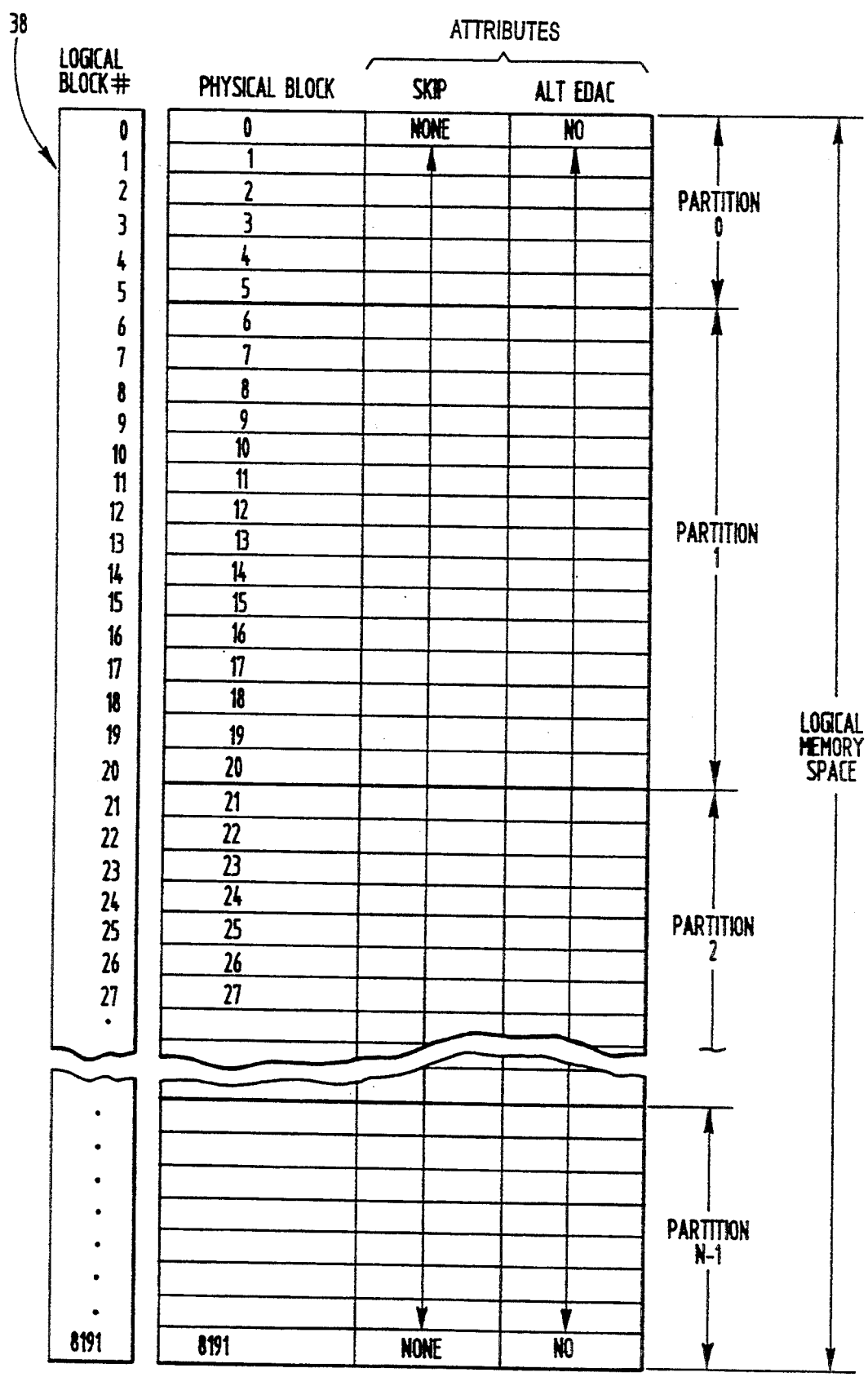
FIG. 3 is a diagram illustrating the logical memory mapping function which maps physical blocks of memory to logical blocks and indicates attributes of physical blocks.

The logical-to-physical mapping employed in the present invention is illustrated in FIG. 3. The table 38 includes a translation table which maps logical blocks to physical blocks of the memory. The logical memory is divided into N partitions, each of which starts on a block boundary. Each partition is treated as a separate addressable memory. In FIG. 3, the logical blocks are mapped in order onto physical blocks, which is the case if there is no failed memory sections. That is, the logical block number and physical block number will correspond to one another.

In addition to the logical-to-physical block translation information, the table 38 includes "block attributes" of bytes to be skipped within a block and whether or not an alternate byte is to be employed for error detection and correction (EDAC), which is used in the event that the memory area normally employed for storing error detection and correction information itself fails. When there are no failed memory areas, there will be no skip information or alternate EDAC use for any of the blocks, as illustrated in FIG. 3.

Figure 4:
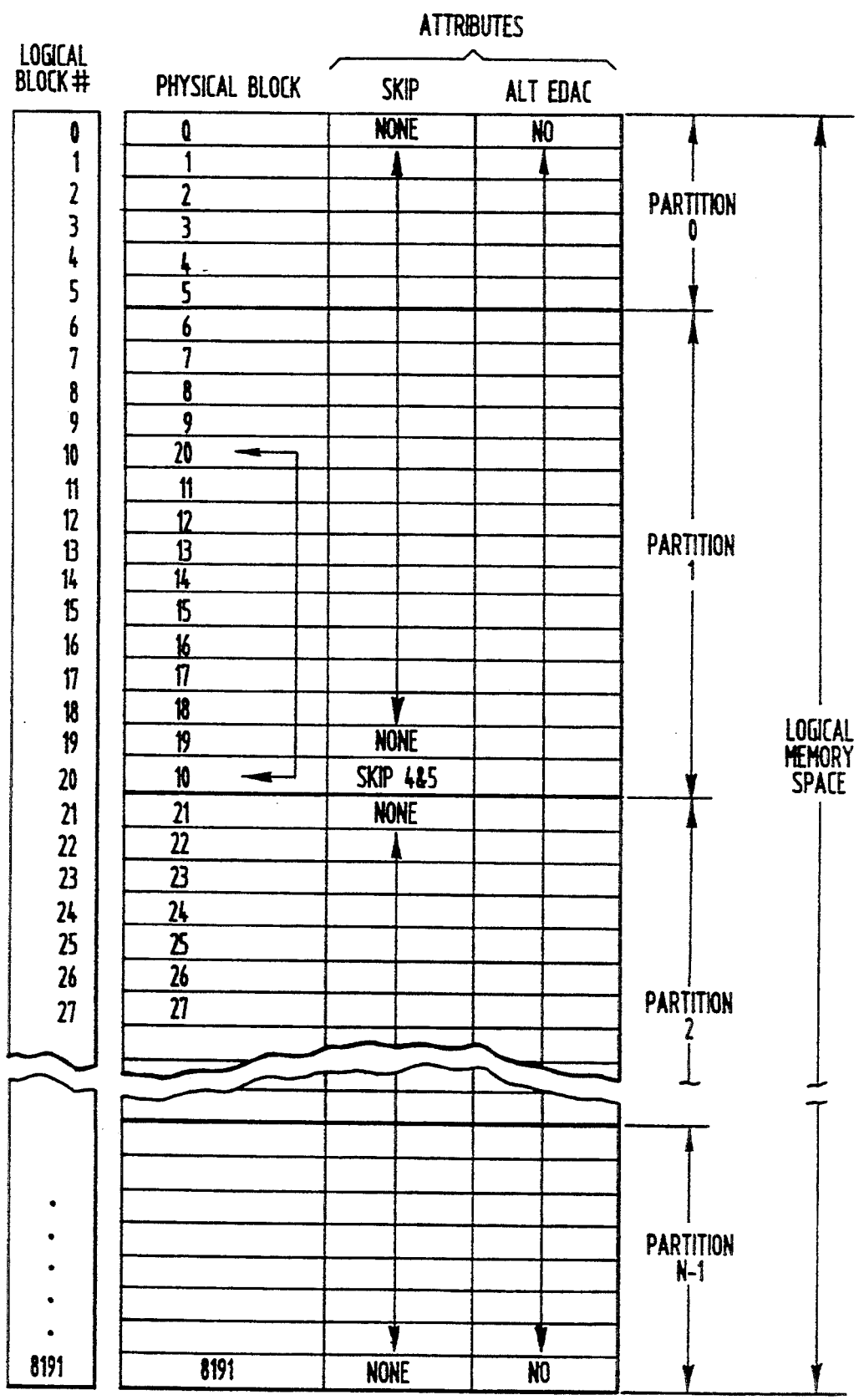
FIG. 4 illustrates a logical memory configuration which has been altered to reconfigure the logical memory upon detection of a failed memory location.

When a memory section has been determined to be bad, the attribute information is updated and the logical-to-physical mapping is altered. This is illustrated in FIG. 4. When it is determined that a byte within a block has failed, such as the fourth byte within block 10 as illustrated at 48 in FIG. 2, the logical mapping is altered to move the block having a failed byte toward the end of the partition. Thus, FIG. 4 illustrates that the logical-to-physical mapping has been changed to map logical block 10 onto physical block 20 (the last physical block in partition 1) and map the logical block 20 onto the physical block 10. In this way, the physical block having failed memory area is moved to the end of the partition.

In addition to altering the logical-to-physical mapping, the skip attribute will be altered to indicate that logical block 20 will skip bytes 4 and 5 in order to avoid failed memory area. For ease of implementation, in the present embodiment, errors are detected on a byte basis but memory areas are removed two bytes at a time. It is for this reason that both the number 4 and 5 bytes are to be skipped even though a single byte in physical block 10 contains failed memory. In the event that a second byte within physical block 10 fails, the skip attribute is updated to indicate that byte 4 and the newly failed byte should be skipped.

The effect of skipping bytes is that the length of data words to be stored in memory are reduced from the nominal seventy-two bit data word length. Rather than avoiding entire seventy-two bit wide blocks when failed memory is detected, the present invention operates to remove small sections of the memory at a time by employing a variable data word length and, in effect, a flexible width data bus. When two bytes are skipped as illustrated in FIG. 4, the useful data word length to be stored in physical block 10 is reduced by two bytes from nine bytes (seventy-two bits) to seven bytes (fifty-six bits). This is accomplished by providing input words which are less than the overall data word length and selectively combining plural input words and EDAC information to form an overall data word. This is illustrated in more detail in FIG. 5.

Data is input to the recorder as logical or data words of sixteen bits each. To form a complete seventy-two bit data word for storage in the memory array, four input words and one EDAC byte are combined, as illustrated at 50, 52, 54 and 55 in FIG. 5. These data words are formed by the input portion of the input and output circuit 14 and transmitted along the data bus 12 for storage in memory 10. When various bytes of a block are not to be used due to detection of failed memory locations, those particular bytes of the in the memory array will be filled with dummy bits as discussed in detail subsequently. Data words of reduced length will be formed by the input portion of the input and output circuit 14, combined with the dummy bits and transmitted along appropriate lines of the bus 12 to the memory. Thus, at 58 in FIG. 5, the first byte of the input word 3 location and the EDAC byte are not to be used. The data word which is formed will therefore be fifty-six useful bits rather than seventy-two bits and will be formed by combining three input words and an EDAC byte. The combined information forms a data word of fifty-six bits which is transmitted along appropriate lines of the data bus 12 to avoid the two bytes which are indicated as not to be used (fill bits are provided for these bytes). Since the normal position for the EDAC byte is not to be used in data word 58, an alternate position in the input word 3 position is used in the case of the block illustrated at 58. This information is also contained in the attribute table which shows that the seventh byte is to be skipped and that the alternate EDAC byte is to be employed. In addition, the logical-to-physical block mapping indicates that physical block number 2 is to be mapped onto logical block number 1 in this example.

A similar situation exists with respect to the block 60 in which it is illustrated that the memory array location corresponding to input word number 2 is to be avoided. Again, a fifty-six bit data word will be formed by appropriately combining input words and an EDAC byte and transmitted on the appropriate lines of the data bus 12 along with fill bits corresponding to the area not to be used for the storage of user data. With respect to words to be stored in physical block 5 indicated at 62 in FIG. 5, four bytes are to be avoided in the memory array. Data words formed to be stored in that block will therefore have a total of forty useful bits. With respect to physical block 8190 indicated at 64 in FIG. 5, a total of six bytes are to be avoided, such that a single input word and the EDAC byte are to be employed, with a resultant data word length of twenty-four useful bits. This is the shortest data word length of useful bits to be employed.

Figure 5:
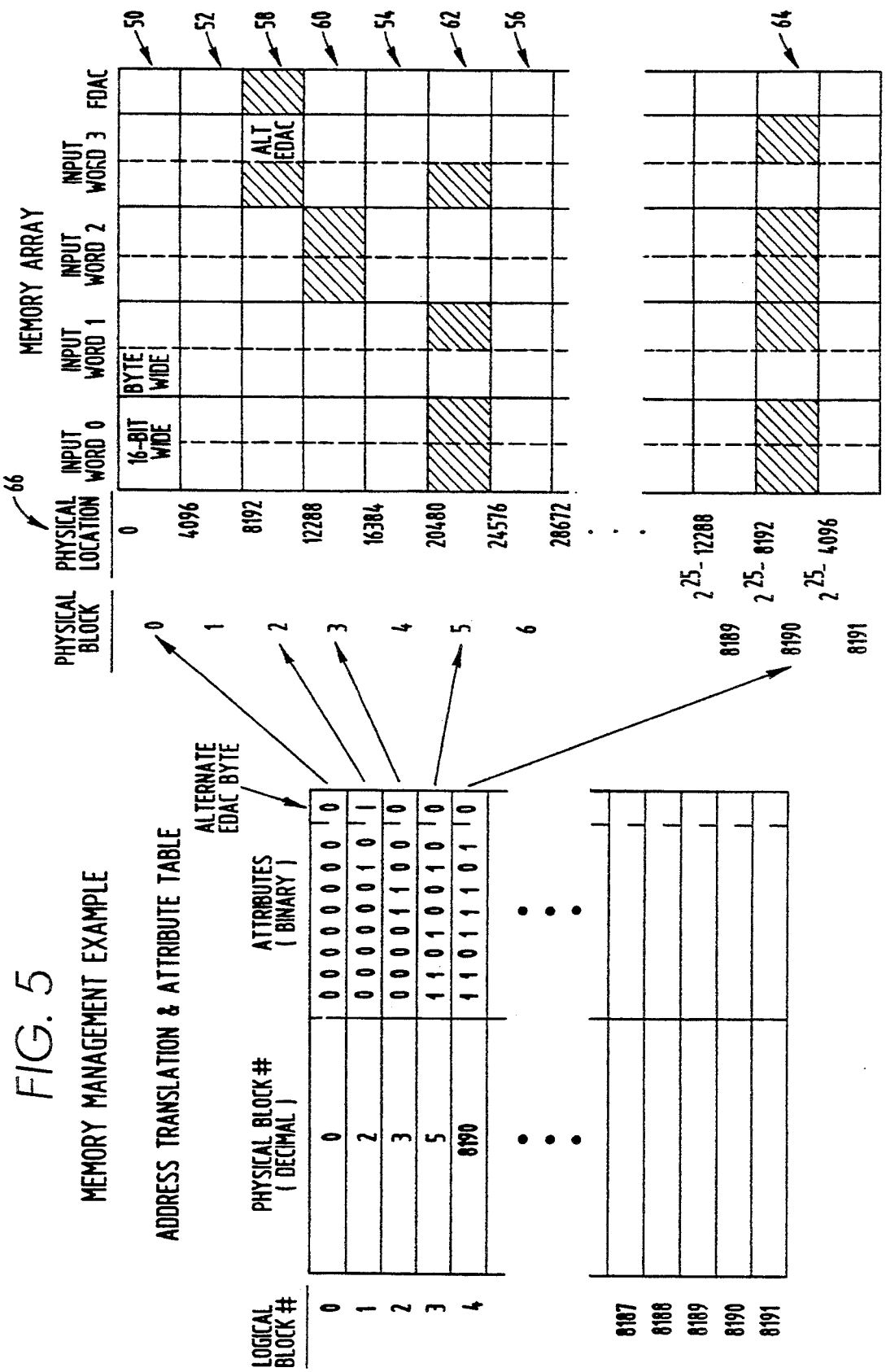
FIG. 5 is a diagram illustrating the logical-to-physical mapping operation and the attribute table indicating failed memory locations which are to be avoided.

FIG. 5 indicates the physical location of each data word at 66. Thus, for the example shown, physical block 0 will contain physical data word locations 0-4095, physical block 1 will contain data word locations 4096-8191, etc. Within a physical block, each data word will have the same length.

Figure 6:
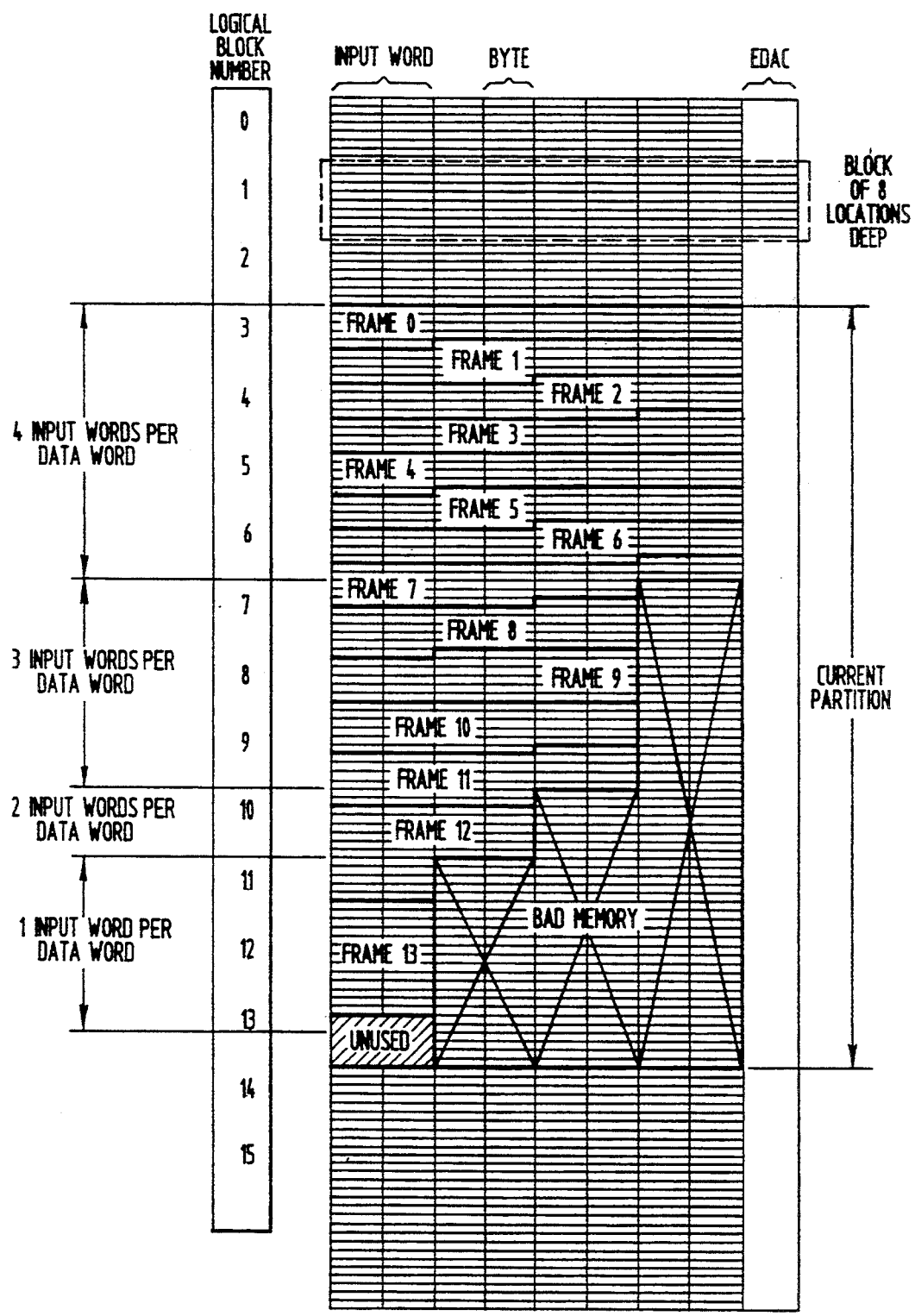
FIG. 6 is a diagram illustrating the logical-to-physical mapping to place logical blocks with an increasing number of failed memory locations toward the end of a partition.

Referring to FIG. 6, the logical configuration of a partition will be described. The example shown in FIG. 6 employs blocks of eight locations deep (as opposed to 4K locations in the actual embodiment) for ease of discussion. Data is entered into the memory in groups of sixteen bit logical or input words referred to as frames. In FIG. 6, each frame is formed of seventeen input words of two bytes each. Each logical block has eight addresses, i.e., addresses for eight data words. The partition illustrated has fourteen frames. Frames are entered contiguous to one another such that data from two different frames may be combined to form a data word for storage in the memory, i.e., a frame may end in the middle of a data word.

In order to take advantage of the maximum data word length as much as possible, the logical-to-physical block mapping is arranged as shown in FIG. 6 such that logical blocks are ordered in accordance with increasing amount of failed memory locations and therefore decreasing useful data word length. In FIG. 6, logical blocks 3–6, i.e., the first four blocks in the current partition, have no memory locations to be skipped and the useful data word length is therefore the full seventy-two bits. Logical blocks 7, 8 and 9 each have two bytes which will be skipped and therefore have a fifty-six useful bit data word length and will include three input words per data word plus one EDAC byte. Logical block 10 is configured to skip four bytes, such that the data word length will include two input words and one EDAC byte for a total useful data word length of forty bits. Logical block numbers 11, 12 and 13 are formed of a single input word and an EDAC byte for a total useful data word length of twenty-four bits. As can be seen in FIG. 6, a single frame may cross one or more block boundaries.

In order to properly store and read out frames, it is necessary to provide the proper logical block address and the address within a block corresponding to the beginning of the frame. These addresses must be converted to physical addresses to actually access the memory 10.

Figure 7A:
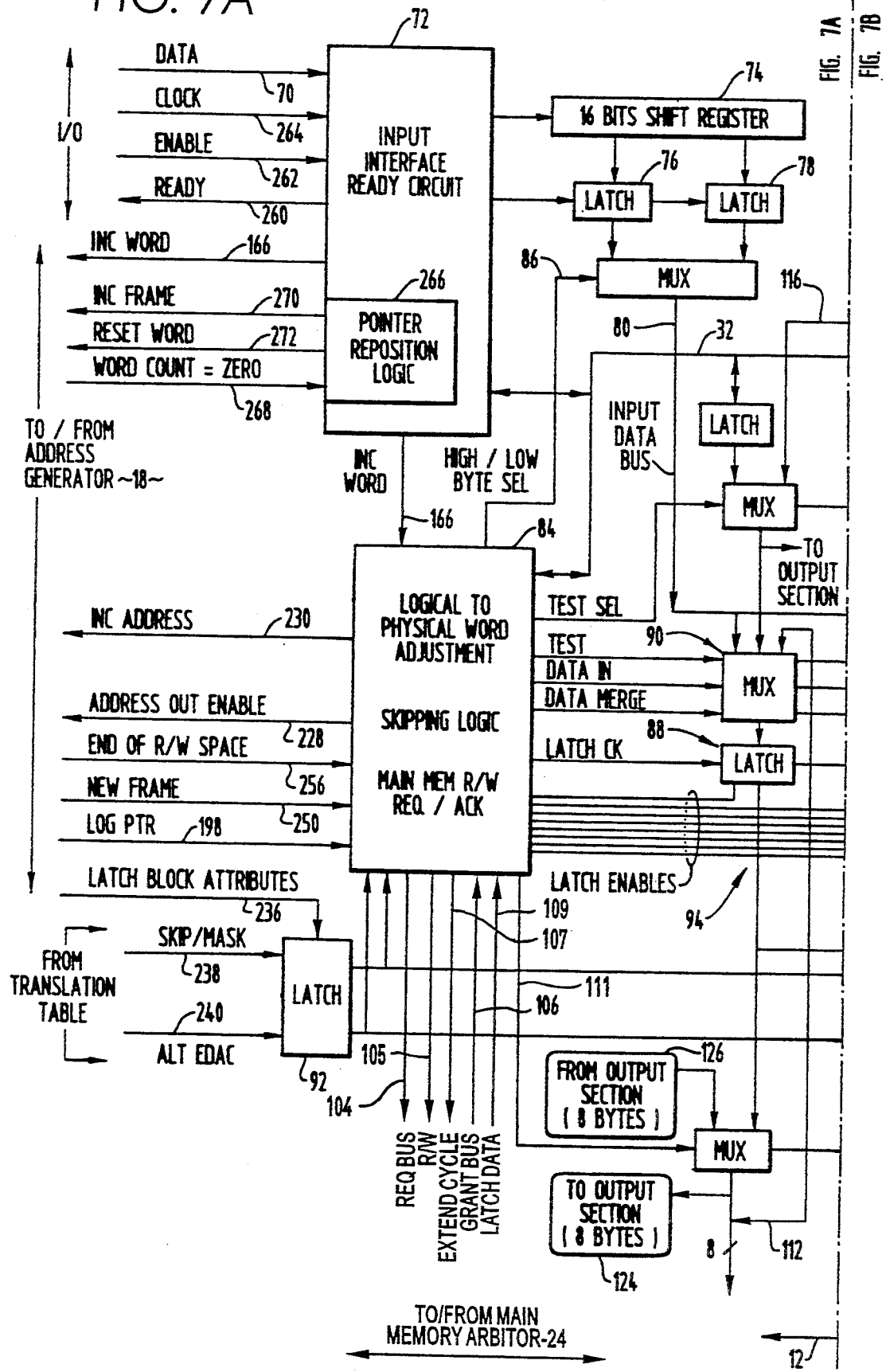
Figure 7C:
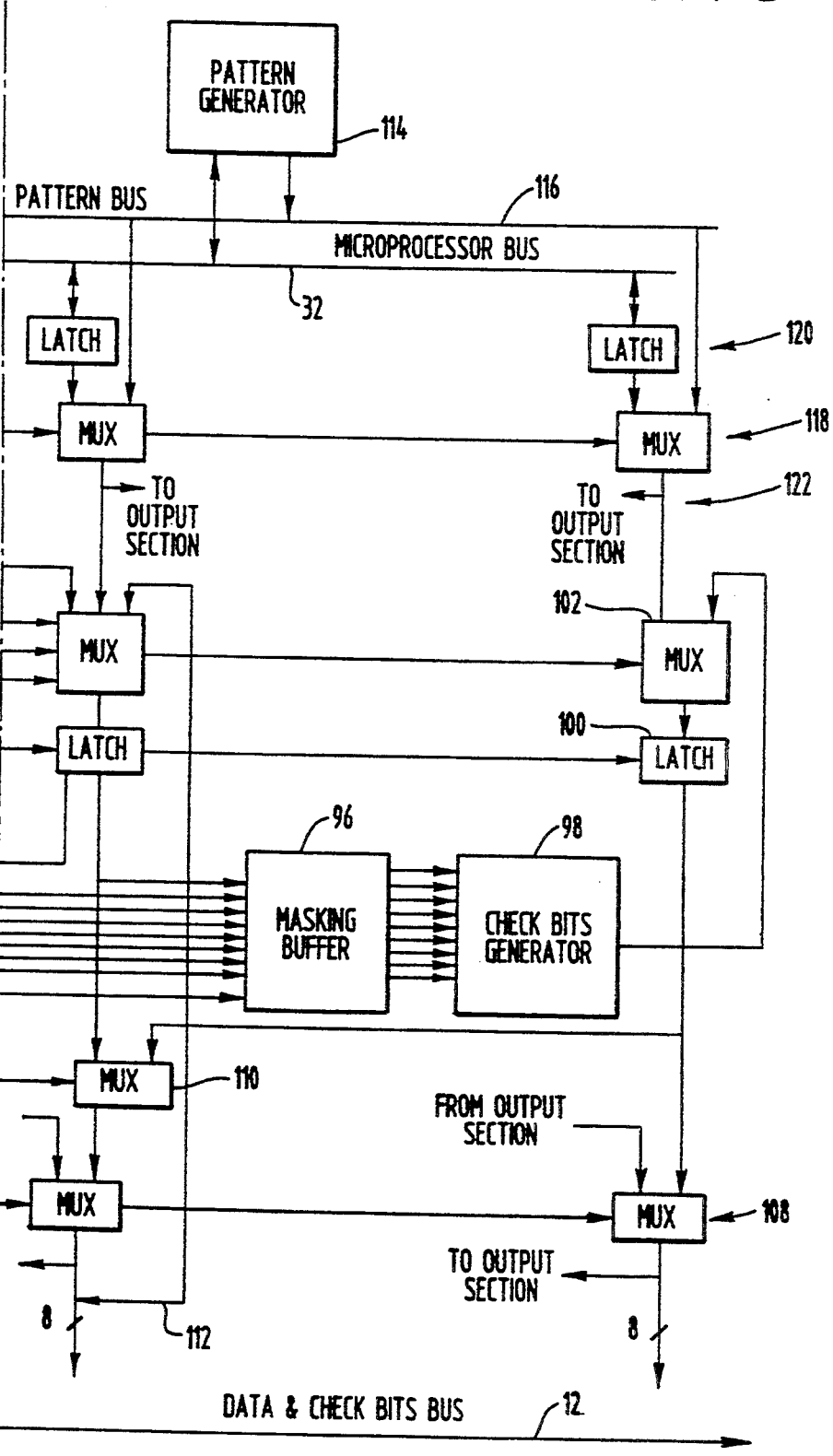

Operation of the input portion of the input and output circuit 14 will be described with reference to FIGS. 7A–C. Data to be recorded in the memory 10 is received in serial fashion on data line 70 at an input interface ready circuit 72. The serial data is converted into sixteen bit input words by means of a shift register 74. The sixteen bit input word is latched into two eight bit latches 76 and 78. The data in each latch is sequentially applied to an input data bus 80 by means of a multiplexer 82 which receives a high/low byte select signal from a skipping logic section 84 on line 86. The two bytes supplied to the data bus 80 are directed to appropriate ones of a group of eight latches 88 via corresponding multiplexers 90. A data in signal from the skipping logic directs the bytes from the latches 76 and 78 to the appropriate latches 88 by means of a data in control signal. Subsequent input words formed at the shift register 74 are directed to appropriate ones of the latches 88 to form up to a sixty-four bit data word. The skipping logic 84 controls the loading of the latches based upon the attribute information, which is loaded into a latch 92 and provided to the circuit 84. Data will be prevented from being loaded into latches which correspond to failed data bus byte or memory byte locations. The latches 88 will thus contain a word of up to 64 bits formed by a combination of one or more input words. When data is being entered, each of the multiplexers 90 will be coupled to the input data bus 80 and the appropriate latch will be enabled for each byte by latch enable signals on lines 94.

The word stored in the latches 88 is provided to a masking buffer 96. Based upon attribute information from the latch 92, the masking buffer substitutes a known data pattern (e.g., all 1's) in failed byte locations, i.e., locations which did not have an input data byte entered into them. When a full system data word of sixty-four bits is assembled, including the failed data byte locations, the encoding of error detection and correction bits occurs by a check bits generator 98. The check bits generator employs the well known Hamming code to generate eight check bits which enable two errors to be detected and one error to be corrected when the data word is later read out of memory. The reason for using a known data pattern in the place of ambiguous data from the failed byte locations is so that a predictable error detection and correction encoding can be successfully performed. The check bits are entered into a latch 100 via a multiplexer 102. The latches 88 and the latch 100 therefore contain the overall data word to be stored in the memory 10 of up to seventy-two bits.

After the error detection and correction encoding is completed, a request for the data bus 12 is made to the bus arbiter 24 (FIG. 1) from the skipping logic 84 on a line 104. In addition, an extend cycle signal is output on line 107 when merging of data is required. Once the bus grant is made, an R/W signal on line 105 indicates whether a read from or write to memory is being done. For writing the up to sixty-four data bits plus eight error code bits equalling up to a seventy-two bit data word are then written into the main memory at the location specified by the input portion of the address generator 18. The granting of the bus by the bus arbitration circuit 24 is provided on line 106 to the skipping logic (followed by the R/W signal on line 105, extend cycle signal on line 107 of necessary, and latch signal on line 109), and the contents of the latches 88 and 100 are then provided to the bus 12 via output multiplexers 108. The multiplexers 108 are provided so that the input and output portions of the input and output circuits can share a common set of system data bus pins. A signal on line 111 controls whether input or output data is selected.

When the latch 92 contains information that the alternate EDAC byte is to be employed, a multiplexer 110 selects the EDAC byte so as to shift its position from its normal last byte of the data word to the next adjacent byte. In such a case, input data words are combined such that the alternate EDAC position (i.e., the eighth byte) is not employed for input data.

The input process is modified whenever the input data must be combined with part of an existing data word. This can occur when the input frame length is not an even multiple of the sixty-four bit portion of the bus used for input data, as illustrated in FIG. 6. In these cases, a partial data word exists at the end of a frame, i.e., a frame ends in the middle of a data word. As an example, a five word frame would be transferred in two operations. The first transfer to memory would move four of the words and the second transfer the remaining fifth word. However, the newly input fifth word must be merged with the existing sixty-four bit memory data from another frame to avoid corrupting the previously stored data. To perform this, the old data is acquired from memory, latched, multiplexed with the new input data, error correction and detection encoded, and then transferred back to memory in an extended bus cycle. Data is obtained from the memory via the output section and provided back to the multiplexers 90 via lines 112. In response to a data merge signal from the skipping logic 84, the multiplexers 90 select this output data and the appropriate latch enable signals are generated to latch the portion of the output data from the memory which is to be maintained. The input data to be merged was previously latched and all of the data in the latches 88 (i.e., the merged data) is then provided to the masking buffer 96 for generation of check bits by the check bit generator 98.

For purposes of testing the memory array to locate failed storage locations, predetermined data patterns from a pattern generator 114 or from the microprocessor 30 may be provided to the latches 88 and 100 for transmission to the memory 10 via the data bus 12. The stored pattern data is then read out by the output section and compared to the input data to determine failed data locations. The pattern data from the pattern generator 114 is provided via a pattern bus 116, and a group of multiplexers 118 is employed to select between the pattern data from the pattern data generator 114 or from the microprocessor. A plurality of latches 120 are employed to build up a pattern from the microprocessor. The pattern data from the multiplexers 118 is provided to the multiplexers 90 and 102 for provision to the latches 88 and 100 and is also provided at outputs 122 to the output section for comparing with the output data.

Figure 8A:
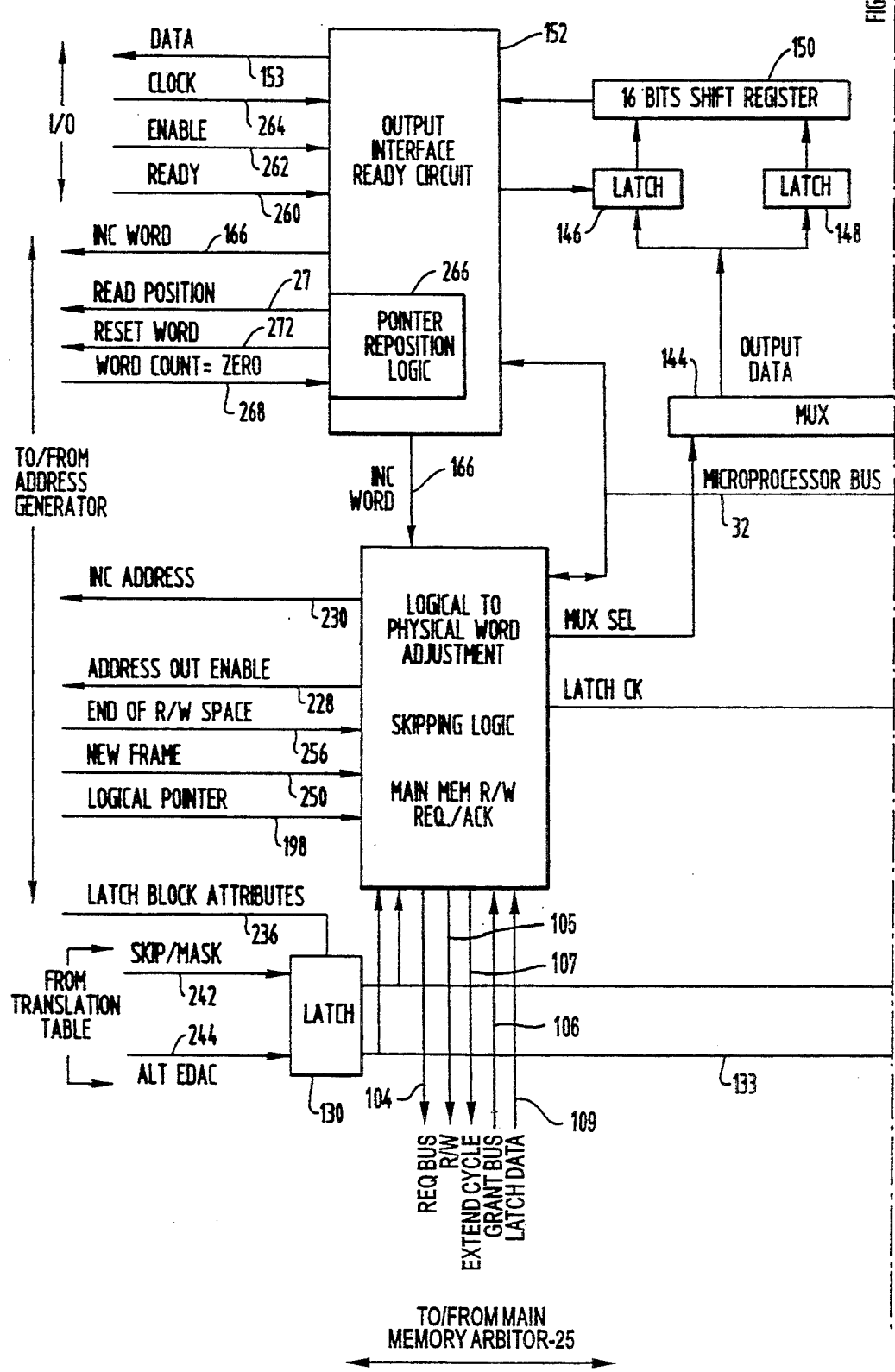
FIGS. 8A, 8B and 8C are a block diagram of the output circuit of the present invention.
Figure 8B:
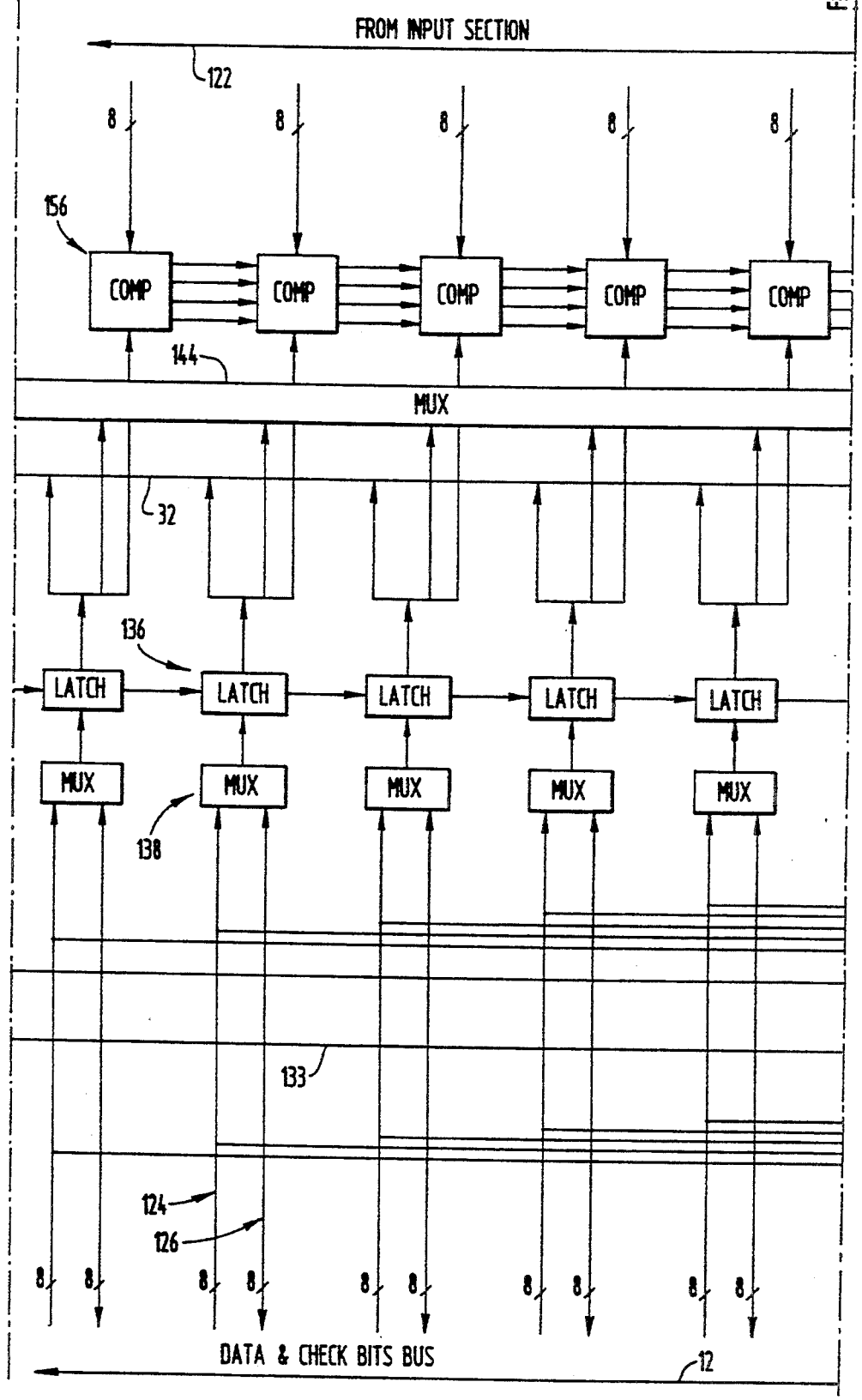
Figure 8C:
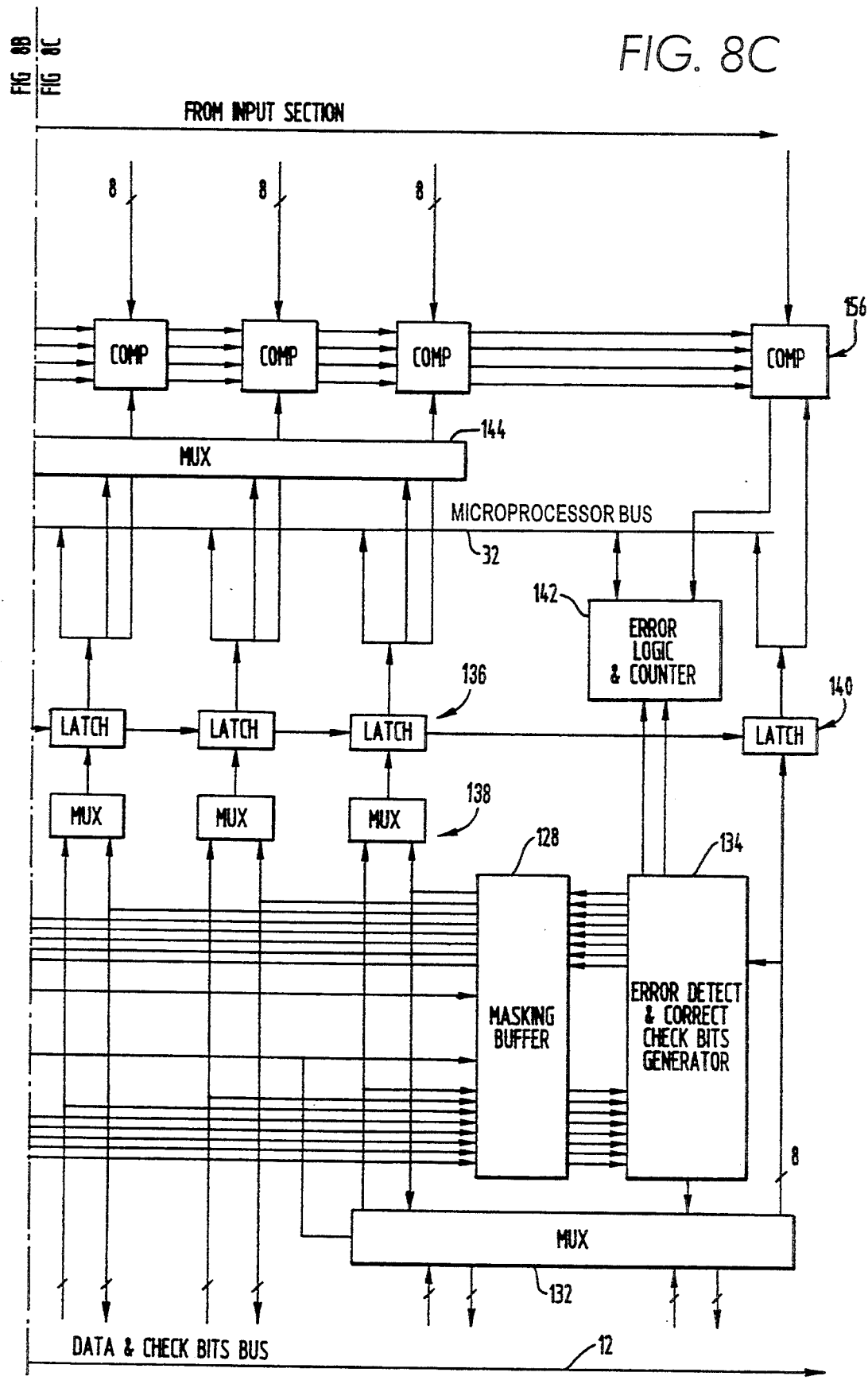

The output section of the input and output circuit 14 is shown in FIGS. 8A–C. The output section operates to obtain a seventy-two bit data word from the memory 10 and select portions of the data word corresponding to memory locations from which the data word was read which are in use. The selected words are subjected to error detection and correction and combined to provide successive sixteen bit output words corresponding to previously recorded input words.

Seventy-two bits of data from the memory are transmitted via the data bus 12 to lines 124, where the data is provided to a masking buffer 128 which masks data from bytes of the memory which are not to be used by replacing them with a known data pattern. The masking is done on the basis of the attribute information stored in latch 130. This information includes the alternate EDAC information which determines which of the last two bytes of the data contains the EDAC information and appropriately controls a multiplexer 132 via line 133. The seventy-two bits of data which have been appropriately masked are then subjected to error detection and correction at 134 to detect and correct errors contained in the memory locations which are being employed. The corrected data is passed back through the masking buffer 128 and provided to latches 136 through multiplexers 138 (and also back to the input section via lines 126 when scrubbing, i.e., the writing of data which was read from memory back to memory if a correctable error is found, is to be done). The EDAC byte is provided directly to a latch 140. The multiplexers are provided to directly transmit the data from the bus 12 to the latches 136 when error detection and correction is not to be provided. Errors which are detected are logged by error logic and counters 142 and provided to the microprocessor for diagnostic purposes.

The data in the latches 136 is provided to a multiplexer 144 which selects appropriate bytes in sequence in order to reconstruct the input words and ignores data from memory locations which are not being employed. The output data from the multiplexer 144 is provided to latches 146 and 148, the outputs of which are provided to a shift register 150 to form an output data word corresponding to an input data word. The output of the shift register provides serial output data which is output through the output interface ready circuit 152 and output line 153.

The control of the multiplexer 144 to select appropriate data to be output is accomplished by skipping logic 154 which selects the appropriate latched data based upon address information, frame information and the attribute information. This operation will be discussed in more detail with reference to the addressing circuitry.

As discussed above, the input and output data can be compared to detect failed memory locations. This is accomplished by comparators 156 which receive the output data from the latches 136 and 140 as well as the data at outputs 122 from the input circuit. The outputs of the comparators can be monitored to detect failed bytes in the memory 10. The microprocessor 30 can also receive the data from latches 136 on bus 32 for diagnostic purposes.

Figure 9B:
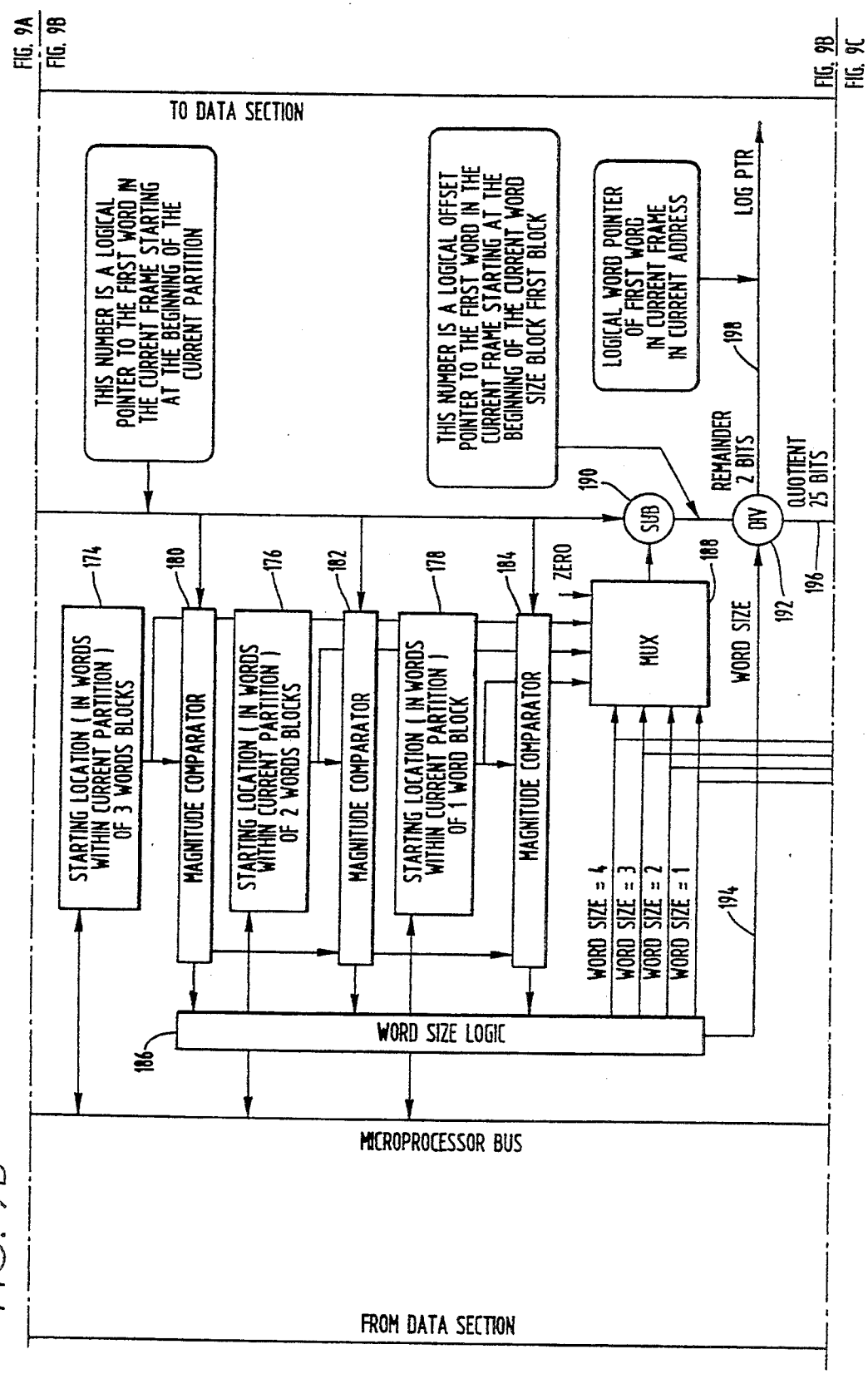

FIGS. 9A–C illustrates the logic arrangement of the address generators 18 and 28. Separate address generation logic is provided both for the input circuit and output circuit and input and output portions of the built-in test circuit. Thus, the address generator 18, for example, contains two of the logic circuits which are illustrated in FIG. 9. The address generator defines the locations in the memory array where data transfers are to occur. The function of the address generator is based on three important points, namely, (1) the need to rapidly reposition the frame pointer (i.e., a logical pointer to the first word in the frame to be accessed), (2) the need to ensure that frame synchronization (proper indication of frame boundaries) is maintained at all times including during multiple frame data transfers, and (3) the need to calculate the data transfer position with respect to memory locations that have failed and have been skipped. During both read and write operations, a pointer is maintained which indicates the first word of the current frame. If the pointer becomes incorrectly positioned during a read operation such that it rests on a non-frame boundary, it is repositioned to the beginning of the current frame boundary. In a like manner, a write pointer which incorrectly rests on a non-frame boundary is moved to the next frame boundary.

Ideally, a memory system would be structured to allow individual mapping of each 16-bit input word. However, this is not feasible for certain applications due to reliability, power and mass limitations. Thus, in the present embodiment of the invention, the memory array is segmented into 8192 logical blocks with each logical block made of 4096 sixty-four bit elements plus eight EDAC bits as discussed above. Up to four logical sixteen-bit words are mapped into the sixty-four bit data word. Fewer logical words are used in the data transfer when bytes are skipped due to failures in a logical block. Whenever a memory failure occurs, that logical block is directed not to use the affected logical word. Data is then mapped around the failed area. This mapping changes the relationship of the memory's logical-to-physical addresses. As a result, the address generator must consider the address displacement due to partial logical blocks containing fewer than four input data words and also the positioning of frame pointers given this displacement.

The address calculation involves a series of arithmetic operations including multiplication, subtraction, division and addition. To ensure frame synchronization, these address calculations are performed at the start of every frame, even during multiple frame transfers.

When a partition of the memory is to be accessed, the address generator is loaded with information from the microprocessor regarding the prior state of the partition. This includes the definition of the number of data words contained in a frame, the number of frames in the partition, the frame counts for the last operation (i.e., the last frame which was accessed), the location within the partition's memory space of the regions having four, three, two or one word logical density and the frame position of the address generator of the other active data circuit (data input or output circuit or built-in test input or output circuit).

When addressing of a partition is to occur, the microprocessor loads a register 160 with a value indicating the number of input words in a frame in the partition being accessed. A frame number counter 162 is loaded with the value of the frame to be addressed. A word number counter 164 counts input words as they are transferred into the input circuit via the interface circuit 72 or out of the output circuit via the output interface 152 in response to an increment word (Inc Word) signal on line 166. The counter 164 is initially set at zero when a frame is to be addressed. As logical words are transferred, the counter 164 is incremented and its value compared with the number of words in a frame by means of comparator 168. A comparator 170 is provided to indicate when the word number is zero.

In order to obtain a logical pointer to the first word in the current frame, referenced to the beginning of the current partition, a multiplier 172 multiplies the frame number count from the counter 162 by the number of words in a frame from the register 160. The output of the multiplier 172 does not take into account unused space due to bad memory locations but rather indicates the logical position within the partition which is being used of the first word in the current frame. A group of registers 174, 176 and 178, comparators 180, 182 and 184, and word size logic 186 are provided to determine if the current frame is located within a four input word per data word block, three input word per data word block, two input word per data word block, or one input word per data word block. The register 174 is loaded from the microprocessor with the starting location (in number of logical words in the current partition) of blocks containing three words per data word. Similarly, a register 176 stores the word value of the starting location of blocks containing two words per data word and register 178 stores the starting location of blocks containing one word per data word.

With reference to FIG. 6, the register 174 would store the word value of the first word of block 7, the register 176 the value of the first word of block 10 and the register 178 the value of the first word of block 11. These values are compared by means of comparators 180, 182 and 184 with the value of the first word in the current frame as output at the multiplier 172 to determine within which word area the first word of the current frame is located. The starting locations in the registers 174, 176 and 178 are provided to a multiplexer 188, along with a zero value. Based upon the values received from the comparators 180, 182 and 184 the word size logic 186 determines whether the first word of the current frame is in an area of four, three, two or one input words per data word, and provides an appropriate select signal to the multiplexer 188. When the location corresponds to four input words per data word, the zero value will be selected, when the value corresponds to three input words per data word, the output of the register 174 will be selected, when the size corresponds to two input words per data word, the output of the register 176 will be selected and when the value corresponds to one input per data word, the output of the register 178 will be selected. The value from the multiplexer 188 is then subtracted from the output of the multiplier 172 by means of a subtractor 190 to obtain a logical offset pointer indicating the number of logical or input words from the beginning of the first block having the same number of input words per data word to the first word of the current frame. For example, if frame 9 illustrated in FIG. 6 is being addressed, its first word is offset from the beginning of the three word per data word section, i.e., the beginning of block 7 by twenty-five input words, and this number would be obtained at the output of subtractor 190 by subtracting the starting location of the first word of block 7 with reference to the beginning of the partition from the number of the first word of frame 9 with reference to the beginning of the current partition.

The output of the subtractor 190 is provided to a divider 192 and is divided by a word size value (one, two, three or four indicating whether there are one, two, three or four input words per data word) on line 194 provided from word size logic 186. The quotient is provided on line 196 and represents the logical starting address location from the start of the first block having the current input word per data word size. Thus, in FIG. 6 frame 9 has a logical starting location which begins in the eighth data word (in this case three input words plus one EDAC byte) from the first word of block 7. Twenty-five logical words divided by three input words per data word equals 8.33. The quotient thus represents the logical starting point of the data word which contains the beginning of the current frame.

The remainder output of the divider 192 represents the location within the data word where the frame begins, and is provided on line 198 as a logical pointer. This value indicates whether the first, second, third or fourth logical word of a data word is the first word of the current frame. Thus, in FIG. 6 the first logical word of frame 9 begins at the second position within the data word, and this fact is indicated on line 198.

The logical starting address for the data word containing the first word of the current frame with reference to the beginning of the first block containing the same word size is added to the logical location start value for the corresponding word size in order to obtain a logical starting location from the beginning of the partition. This is accomplished by adder 200, which adds the quotient value on line 196 with an appropriate value indicating the logical location start for the various word sizes provided from one of registers 202, 204, 206 and 208, respectively, via a multiplexer 210. The output of adder 200 on line 212 is therefore the total logical address within the partition for the data word containing the first logical word of the current frame. This value is separated into a more significant portion which is loaded into a counter 214 which provides a logical block number address and a less significant portion which is loaded into a counter 216 which provides a physical address to address a particular data word within a particular physical block. The logical block address is provided on line 218 (which is a part of line 34 of FIG. 1) to provide the physical block address from translation table 38 corresponding to the current logical block address. The new frame signal 250 provided to the update request logic 234 generates a translation table data request on line 235. The update grant signal 237 is returned when data is valid at physical address line 220. These signals are included in the interfaces 39, 41 shown in FIG. 1 between the address generators 18, 28 and the translation table arbiter 37. The physical address data is returned on line 220 to a latch 222. The latched value is thus a physical block address corresponding to the logical block address. This is provided to the address bus as the more significant bits of the overall address, whereas the physical address from the counter 216 is provided as the less significant bits to the address bus. The outputs of the counters 214 and 216 are coupled to the address bus via buffer amplifiers 224 and 226, respectively, which are enabled by an Address Out Enable signal on line 228.

Thus, an address will be formed such that the first 72-bit data word of the frame to be accessed will be addressed. A data word will then be written into or read out of the appropriate memory location. Subsequently, an increment address signal will be received on line 230 to increment the counter 216 and step to the next data word. When the last data word of the physical block has been addressed, a carry signal on line 232 will cause the counter 214 to increment to the next logical block, and a new physical block will then be determined. In this fashion, all of the data words containing data for a frame will be addressed in sequence.

The block increment signal on line 232 is also provided to update request logic 234 which causes the corresponding physical address to be latched in latch 222 and in addition causes the block attributes for the addressed block to be latched in the latches 92 and 130 of the input circuit and output circuit by means of a control signal on line 236. The attributes corresponding to the physical block being addressed are provided from the translation table to the latch 92 on lines 238 and 240 (FIGS. 7A-C) and to latch 130 via lines 242 and 244 (FIGS. 8A-C). With these attributes latched, the appropriate bytes of a data word will be skipped when inputting or outputting data as discussed above with respect to FIGS. 7A-C and 8A-C.

The logical pointer on line 198 is provided to the skipping logic 84 and 154 of the input and output circuits, respectively. Based upon this value, the appropriate latch enable signals will be generated to store data into the desired ones of the latches 88 in the input circuit and the appropriate latches will be selected by multiplexer 144 in the output circuit.

As each sixteen bit logical word is transferred from the input interface circuit 72 or from the output interface circuit 152, an increment word signal is generated on line 166 to cause the word number counter 164 to increment as discussed above. After a number of words corresponding to the number of words in a frame have been transferred through the corresponding interface circuit, frame increment logic 246 will provide an increment signal to increment the frame number counter 162 via OR gate 248. At each new frame, a new calculation will be performed to determine the new logical pointer on line 198 and logical starting address on line 212. The logic 246 also provides a signal on line 250 indicating a new frame which is provided to the skipping logic 84 and 154 of the input and output circuits. Based upon a comparison of the current frame number with a value of the last frame in a partition stored in a register 252, by means of a comparator 254, the logic 246 can also provide an end of read/write space signal on line 256 indicating that the last frame of the partition has been reached. The new frame signal is provided to the skipping logic 84 and 154 to appropriately control the transfer of data in a new frame in accordance with its corresponding logical pointer. The end of read/write space signal is also provided to the skipping logic 84 and 154 to appropriately limit the writing and reading of data.

In the event that the pointer on line 198 (FIGS. 7A-C, 8A-C and 9A-C) for some reason is not positioned on a frame boundary at the beginning of transfer of a frame, it is necessary to quickly reposition the pointer to ensure that all data transfers will begin on a frame boundary. Referring to FIGS. 7A-C, when the input circuit is ready to receive a new frame, a ready signal will be provided on line 260. An enable signal on line 262 will then be provided from the data source indicating that it is ready to transfer a new frame of data. Data on the input line 70 is clocked by means of a clock signal on line 264. When the enable line 262 is asserted, pointer reposition logic 266 in the interface circuit 72 checks to determine if the word count is zero, as indicated on line 268 (FIGS. 9A-C), which provides the output from comparator 170. If the word count is not zero, it is an indication that the write pointer is not in the first word of a frame and must therefore be repositioned. The logic 266 therefore sends an increment frame signal on line 270 to OR gate 248 to cause the frame number to be incremented and a reset word signal on line 272 to OR gate 274 (FIGS. 9A-C) to reset the word number counter 164 to the beginning of the next frame.

In the case of read repositioning, a similar operation is performed, with a read reposition signal on line 276 being sent to the frame logic 246 which in turn will send a decrement signal to the frame number counter 162. In this fashion, during writing the reposition logic will cause the frame to be incremented to write into the next frame location in the memory and during reading the frame will be decremented to start reading from the previous frame.

From the foregoing description, it will be appreciated that the architecture of the present invention allows for bus failures as well as memory failures, thus further enhancing the utility of the invention. For example, should any line of the bus 22 fail, or if any associated bus drivers or receivers fail, memory areas corresponding to the failed bus line can be mapped out over the entire memory address. This permits the recorder to continue to be used where otherwise the entire bus would be rendered unusable (and entire system unless full bus redundancy were provided). Having a bus which can tolerate a partial failure thus provides significant benefits. The flexible width data bus concept is thus useful to map out failed memory areas and to avoid failed bus lines.

In summary, the flexible width data bus configuration of the present invention facilitates maximum efficiency in the utilization of memory space. By detecting failed memory locations and mapping out such locations on a fraction of a data word basis, the memory capacity will decrease gradually and useful memory will be maintained to the greatest extent possible. The requirement for spare memory space is thus significantly reduced, thereby reducing both cost and weight.

What is claimed is:

1. A data recorder comprising:
   memory means for storing data including a plurality of data word storage areas wherein each of the data word storage areas includes at least one storage location;
   a data bus for conveying data to and from the memory means, the data bus having a plurality of bus lines;
   input means for receiving data, forming data words of variable word length, designating particular bus lines for data transmission to the memory means and providing the data words to the designated bus lines for transmission to the memory means and storage in a selected word storage area, wherein the number of bits in each data word does not exceed the number of bus lines and the data words are formed and bus lines designated in accordance with the number and positions of storage locations in each data word storage area which are to be employed; and output means for causing a selected stored data word to be read out from the memory means.

2. The recorder of claim 1 wherein:

each data word includes at least one separable logical word; and the output means includes:
 means for receiving the selected data word from the memory means;
 means for separating each data word into at least one logical word and providing the logical words in a preselected sequential order as output words.

3. The recorder of claim 2 wherein:

each data word includes at least one separable logical word wherein the number of logical words in a data word is the word length; and the input means includes:
 receiving means for sequentially receiving logical words and combining logical words to form data words.

4. The recorder of claim 1 further including:

addressing means for addressing a data word storage area; and mapping means for maintaining a record of which storage locations in each data word storage area can be employed for storing data.

5. The recorder of claim 4 further including:

test means for detecting failed storage locations; and wherein said mapping means maintains a said record indicating each failed storage location.

6. The recorder of claim 5 wherein:

each data word storage area has the same number of storage locations;

each data word storage area and each storage location has a physical location within the memory means; and the mapping means includes:
 a logical-to-physical mapping means for maintaining a logical memory map in which a logical memory is correlated with the physical locations of the data word storage areas within the memory means, wherein:
 the logical memory map is updated to indicate failed storage locations detected by the test means; and
 the logical memory map indicates the ordering in which data transmitted to the memory means from the input means is to be stored within the memory means such that data transmitted to the memory means is sequentially stored first in data word storage areas having the maximum number of usable storage locations and then data transmitted to the memory means is stored in data word storage areas having fewer usable storage locations.

7. The recorder of claim 6 wherein:

each data word includes at least one logical word;

the logical words which are grouped in equal size groups to form frames and data is transmitted to the memory means a minimum of one frame at a time;

the recorder further includes means for indicating the boundary of a frame with respect to a data word, whereby portions of frames can be recorded contiguously within a single data word storage area.

8. The recorder of claim 6 wherein the memory means further comprises a plurality of blocks wherein:

each block includes a plurality of data word storage areas; and the logical-to-physical mapping means maintains the logical memory map such that the logical memory is correlated with the physical locations of each block, wherein:

the logical memory map indicates the ordering in which data transmitted to the memory means from the input means is to be stored within the memory means such that data transmitted to the memory means is sequentially stored first in blocks having the maximum number of usable storage locations and then data transmitted to the memory means is stored in blocks having fewer usable storage locations.

9. The recorder of claim 4 wherein the mapping means includes a logical-to-physical mapping means for maintaining a logical memory map in which a logical memory is correlated with the memory means.

10. The recorder of claim 5 wherein said the addressing means comprises storage addressing means for addressing data word storage areas for recording data words wherein said storage addressing means accesses said record to ascertain failed storage locations and records data words only in storage locations which have not failed.

11. The recorder of claim 1 wherein the number of bus lines in the data bus is the same as the number of storage locations in the corresponding data word storage area.

12. A data recorder comprising:

memory means for storing data including a plurality of data word storage areas wherein each data word storage area includes a plurality of storage locations;

a data bus having a plurality of bus lines for carrying data to and from the storage locations of each data word storage area;

addressing means for addressing data word storage areas to enable one data word at a time to be transmitted to or from the memory means on the data bus;

input means coupled to the data bus for receiving input words whose length is less than the length of a data word storage area and combining one or more input words to form a portion of a data word, the input means including error detection and correction encoding means for generating an error detection word based upon at least the formed portion of a data word and means for combining the formed portion of a data word and the error detection word to form a data word wherein the data words have a variable word length of up to the number of storage locations in each storage area; and means for providing the data word to the data bus for carrying to the memory means;

output means for receiving data words from the memory means via the data bus, performing error detection and correction to detect and correct errors in input words contained in a received data word, dividing the data word into output words corresponding to input words; and control means for determining which storage locations of each data word storage area are to be used for each data word and controlling the input means to form data words of a word length that does not exceed the number of storage locations to be used of the storage area to be used.

13. The recorder of claim 12 wherein the control means includes table means for maintaining a table indicating which storage locations of each data word can be employed for storing data.

14. The recorder of claim 13 wherein:
the memory means further comprises a plurality of blocks having a plurality of data word storage areas and
wherein the table means maintains said table identify for each block the storage locations of each data word in the block which may be used for storing data such that if any storage location of any storage area within the block may not be used than that storage location also may not be used for any other storage area within the block.

15. The recorder of claim 14 including test means for detecting failed storage locations in the memory means, wherein the table means modifies the table to indicate that the failed storage locations are not to be used for storing data.

16. The recorder of claim 15 wherein:
data is recorded in the form of frames each including a plurality of input words in a contiguous manner in the memory means;
the control means includes means for controlling the input means to merge input words contained in two different frames to form a portion of a data word and for controlling the output means to read out from a data word only words from a designated frame.

17. The recorder of claim 16 wherein each block has a physical address within the memory means; and the control means further includes logical memory space means for defining a logical memory space including a plurality of logical blocks of sequential addresses, mapping means for mapping each logical block to a physical block of the memory means, and means for receiving a logical block address from the logical memory space means and causing the addressing means to address the corresponding physical block.

18. The recorder of claim 17 wherein the mapping means operates to map logical blocks in order of decreasing number of storage locations available for storing data in the corresponding physical blocks.

19. The recorder of claim 17 wherein the control means further comprises means for receiving a logical block address and causing the addressing means to address the corresponding physical block.

20. The recorder of claim 12 wherein:
the input means includes masking means for providing one or more masking words corresponding to storage locations which are not to be employed, wherein the error detection word is formed based upon the formed portion of the data word and the masking words; and
the output means includes means for providing one or more of said masking words when a data word is read out of the memory, combining the one or more masking words and the data word to form a combined masking and data word and performing error detection and correction based upon the combined masking and data word.

21. The recorder of claim 12 wherein the control means further comprises means for controlling the output means to select the portion of a data word which has been read out of the memory means to be used to form an output word.

22. A memory system comprising:
memory means for storing data in a plurality of data word storage areas, wherein each data word storage area has a plurality of bit storage locations;
a bus having a plurality of separate data lines for transmitting data to and from the memory wherein there is the same number of data lines as there are storage locations in each data word storage area;
addressing means for addressing one data word storage area at a time; and
control means for forming data words of a variable number of bits wherein the number of bits in each data word does not exceed the number of data lines and providing the bits on selected lines of the data bus for storage in corresponding storage locations of respective data word storage areas.

23. A method for recording data in a data recorder wherein the data recorder comprises a memory means having a plurality of data word storage areas each having a plurality storage locations for storing a single bit, a data bus having a plurality of bus lines, wherein the number of storage locations in each data word storage area is the same as the number of bus lines, comprising:
receiving data in the processing means in the form of input words comprising at least one bit;
forming data words of varying numbers of bits wherein the forming step includes combining input words and the number of bits in each data word does not exceed the number of bus lines;
designating bus lines for transmitting data from the processing means to the memory means wherein each bus line carries one bit of each data word;
transferring data from the processing means to the memory means through the designated bus lines wherein each bus line corresponds to a particular storage location in each data word storage area.

24. The method of claim 23 further comprising detecting failed storage locations.

25. The method of claim 24 wherein the designating bus lines step designates only bus lines corresponding to storage locations that have not been determined to be failed storage locations in the detecting step.

* * * * *